United States Patent
Tucker et al.

(10) Patent No.: US 6,538,748 B1
(45) Date of Patent: Mar. 25, 2003

(54) TUNABLE FABRY-PEROT FILTERS AND LASERS UTILIZING FEEDBACK TO REDUCE FREQUENCY NOISE

(75) Inventors: Rodney S. Tucker, Hawthron (AU); Wayne V. Sorin, Mountain View, CA (US); Douglas M. Baney, Los Altos, CA (US)

(73) Assignee: Agilent Technologies, Inc, Palo Alto, CA (US)

( * ) Notice: Subject to any disclaimer, the term of this patent is extended or adjusted under 35 U.S.C. 154(b) by 0 days.

(21) Appl. No.: 09/550,548

(22) Filed: Apr. 14, 2000

(51) Int. Cl.$^7$ ................................................. G01B 9/02
(52) U.S. Cl. ...................... 356/519; 356/382; 356/506; 356/454; 356/480
(58) Field of Search ................................. 356/519, 506, 356/352, 454, 480

(56) References Cited

U.S. PATENT DOCUMENTS 5,739,945 A * 4/1998 Tayebati ...................... 257/419
6,078,395 A * 6/2000 Jourdain et al. ............. 356/519
6,295,130 B1 * 9/2001 Sun et al. ..................... 356/454

* cited by examiner

Primary Examiner—Robert H. Kim
Assistant Examiner—George Wang

(57) ABSTRACT

A tunable optical cavity constructed from a fixed mirror and a movable mirror is disclosed. A circuit applies an electrical potential between first and second electrically conducting surfaces thereby adjusting the distance between the fixed and movable mirrors. The fixed mirror and the moveable mirror are positioned such that the mirrors form the opposite ends of the optical cavity. The distance between the fixed mirror and the moveable mirror is a function of the applied electrical potential. The thermally induced vibrations are reduced by utilizing an electrical feedback circuit that measures the distance between the mirrors. The feedback circuit dynamically changes the potential between the substrate and the support member so as to reduce fluctuations in the cavity resonance frequency.

7 Claims, 4 Drawing Sheets

TUNABLE FABRY-PEROT FILTERS AND LASERS UTILIZING FEEDBACK TO REDUCE FREQUENCY NOISE

FIELD OF THE INVENTION

The present invention relates to optical filters, and more particularly, to tunable Fabry-Perot optical resonators, filters and lasers constructed therefrom.

BACKGROUND OF THE INVENTION

Tunable optical resonators are utilized in optical communication systems and in the construction of lasers. Optical filters and lasers based on Fabry-Perot resonators can be constructed using microelectromechanical machining (MEM) techniques, and hence, can, in principle, provide an economically attractive tunable filter or tunable laser. In such devices, a Fabry-Perot resonator cavity is formed between two mirrors. One of these mirrors is flat and located on a semiconductor substrate. The other mirror may be curved and is suspended on a number of micro-mechanical cantilevers. Application of a tuning voltage between the cantilevers and the substrate causes the suspended mirror to move towards the fixed mirror on the substrate, thereby reducing the spacing between the two mirrors of the Fabry-Perot resonator. Since the filter's bandpass frequency is determined by the mirror spacing, a reduction in spacing between the two mirrors causes the resonant optical frequency of the cavity to increase. The shift in the resonant frequency enables the device to be used directly as a tunable bandpass filter. If an optically-pumped or electrically-pumped optical gain medium (active region) is placed in the cavity, the device becomes a tunable laser, with the lasing wavelength controlled by the resonant frequency of the Fabry-Perot cavity.

Prior art MEM Fabry-Perot filters exhibit a significant amount of noise, which limits the usefulness of these devices. The noise results from mechanical vibrations in the mirror connected to the cantilevers. This noise causes variations in the spacing between the mirrors, which in turn, causes the resonant frequency and amplitude of the light emitted from the filter to exhibit a corresponding noise spectrum. The noise broadening of the resonant frequency can double the width of the bandpass response of a filter and can substantially increase the linewidth of a laser constructed from such a filter, thereby making the filter or laser unsuitable for many applications.

The mechanical vibrations can be reduced by stiffening the cantilevers. The mechanical vibrations result from thermal noise in the movable mirror and its micro-mechanical cantilevers. Since the moveable mirror is in thermal equilibrium with the air around the mirror, the mirror vibrates with an amplitude determined by the air temperature and the mechanical properties of the mirror and support. This vibration causes mechanical fluctuations in the position of the movable mirror relative to the other mirror. These mechanical fluctuations, in turn, cause fluctuations in the resonant optical frequency of the Fabry-Perot cavity. The mechanical fluctuations are exacerbated by any mechanical resonance in the moveable mirror and its support cantilevers. Stiffening a cantilever increases the spring constant of the cantilever, and hence, reduces the amplitude of the fluctuations corresponding to any given equilibrium temperature.

Unfortunately, stiffening the cantilever also reduces the range over which the resonance frequency can be tuned. In general, there is a maximum deflection voltage that can be applied to the device. This voltage is usually determined by the driving circuitry and the voltage breakdown characteristics of the Fabry-Perot resonator structure. The maximum deflection determines the maximum range over which the frequency of the filter or laser can be tuned. Hence, stiffening the cantilever by increasing the thickness of the support arm also reduces the range over which the device can be tuned.

Broadly, it is the object of the present invention to provide an improved MEM Fabry-Perot resonator.

It is a further object of the present invention to provide a MEM Fabry-Perot resonator that has reduced noise while maintaining or improving the range over which the resonance frequency can be tuned.

These and other objects of the present invention will become apparent to those skilled in the art from the following detailed description of the invention and the accompanying drawings.

SUMMARY OF THE INVENTION

The present invention is a tunable optical cavity constructed from a fixed mirror and a movable mirror. The fixed mirror is attached to a substrate having a first electrically conducting surface. A support member having the moveable mirror supported thereon and having a second electrically conducting surface, is suspended above the substrate. A circuit applies an electrical potential between the first and second electrically conducting surfaces thereby adjusting the distance between the fixed and movable mirrors. The fixed mirror and the moveable mirror are positioned such that the mirrors form the opposite ends of the optical cavity. The distance between the fixed mirror and the moveable mirror is a function of the applied electrical potential. The thermally induced vibrations are reduced by utilizing an electrical feedback circuit that measures the distance between the mirrors. The feedback circuit dynamically changes the potential between the substrate and the support member so as to reduce fluctuations in the cavity resonance frequency. The instantaneous cavity resonance frequency can be measured by comparing the cavity resonance frequency with a standard optical signal, or by using a circuit for measuring capacitative coupling between the support member and the substrate. The feedback circuit varies the potential between the substrate and the support member so as to reduce the fluctuations in said measured cavity resonance frequency or the capacitance. The optical cavity of the present invention can be utilized in constructing a tunable laser by including an active layer for amplifying light trapped in the cavity. In the case of a tunable laser, the thermally induced fluctuations can be reduced by including an interferometer or other frequency-selective device to determine the instantaneous wavelength of the light from the laser. An electrical feedback circuit varies the potential between the substrate and the support member so as to maintain the measured instantaneous wavelength at a specified value.

DETAILED DESCRIPTION OF THE INVENTION

Figure 2:
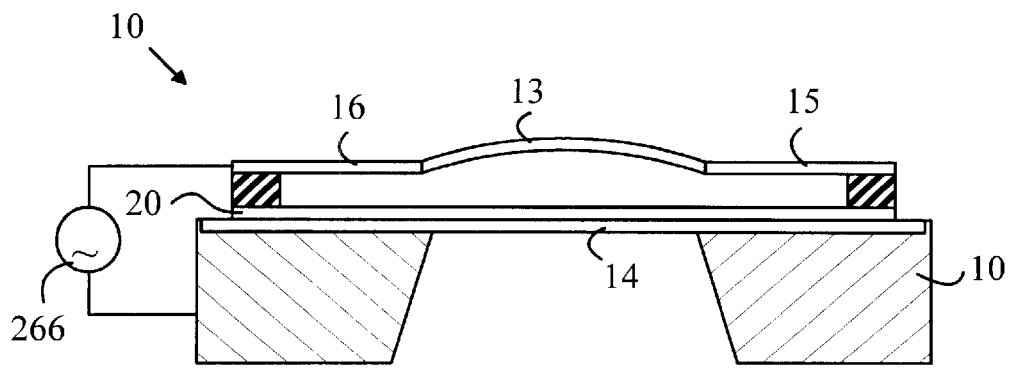
FIG. 2 is a cross-sectional view of the laser shown in FIG. 1 through line 11–12.
Figure 1:
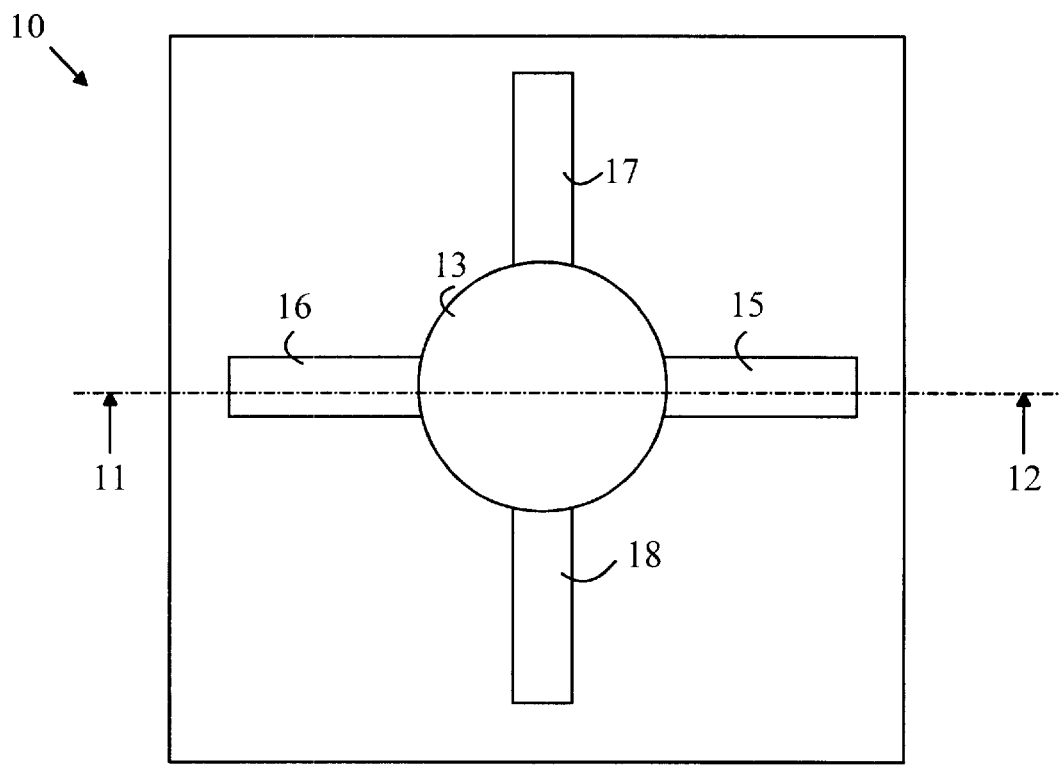
FIG. 1 is a top view of a Fabry-Perot based filter or laser.

The present invention may be more easily understood with reference to FIGS. 1 and 2. FIG. 1 is a top view of a Fabry-Perot based filter or laser. FIG. 2 is a cross-sectional view of the laser shown in FIG. 1 through line 11–12. A Fabry-Perot resonator cavity is formed between mirrors 13 and 14. Mirror 14 is flat and located on a semiconductor substrate 10. The mirror 13 is typically curved and is suspended on a number of micro-mechanical cantilevers shown at 15–18. The mirrors are preferably constructed from a number of layers of transparent material having indices of refraction that alternate from layer to layer. Such mirrors are well known to the art of semiconductor lasers, and hence, will not be discussed in detail here. To simplify the drawing, the layered structure of the mirrors has been omitted.

The application of a tuning voltage, generated by driver 266, between the cantilevers and the substrate causes suspended mirror 13 to move towards mirror 14, thereby reducing the spacing between the two mirrors of the Fabry-Perot cavity. Since the resonant frequency of the cavity is determined by the distance between the mirrors, this reduction in spacing between the two mirrors causes the resonant optical frequency of the cavity to increase. The shift in the resonant frequency enables the device to be used directly as a tunable bandpass filter. If an optically-pumped or electrically-pumped optical gain medium 20 is placed in the cavity, the device becomes a tunable laser, with the lasing wavelength controlled by the resonant frequency of the Fabry-Perot cavity.

A key feature of the MEM filter and MEM tunable laser is the relatively small spacing between the two mirrors of the optical cavity. Mirror spacings of a few microns can be utilized with a tuning range of 60 nanometers or more, for an input tuning voltage range of about 30 volts.

As noted above, prior art devices of the type shown in FIGS. 1 and 2 suffer from undesirable frequency noise caused by the thermal energy associated with the mirror and its support structure. In essence, for any fixed input control voltage applied to the device, the center frequency of the filter randomly fluctuates about an average value. Since the filter attenuation function varies with frequency, this fluctuation in the center frequency leads fluctuations in the amplitude of the filtered light. These fluctuations render the filter useless in many applications.

The present invention is based on the observation that the noise mechanism responsible for the frequency fluctuations is thermal noise in the movable mirror and its micro-mechanical cantilevers. Since the moveable mirror is in thermal equilibrium with the air around the mirror, the mirror vibrates with an amplitude determined by the air temperature and the mechanical properties of the mirror and support. This vibration causes mechanical fluctuations in the position of the movable mirror relative to the other mirror. These mechanical fluctuations, in turn, cause fluctuations in the resonant optical frequency of the Fabry-Perot cavity. The mechanical fluctuations are exacerbated by any mechanical resonance in the moveable mirror and its support cantilevers.

The frequency spectrum of the noise is relatively low, typically less than 1 MHz. This noise spectrum is sufficiently low that feedback techniques can be utilized to cancel out or greatly reduce the noise.

Figure 3:
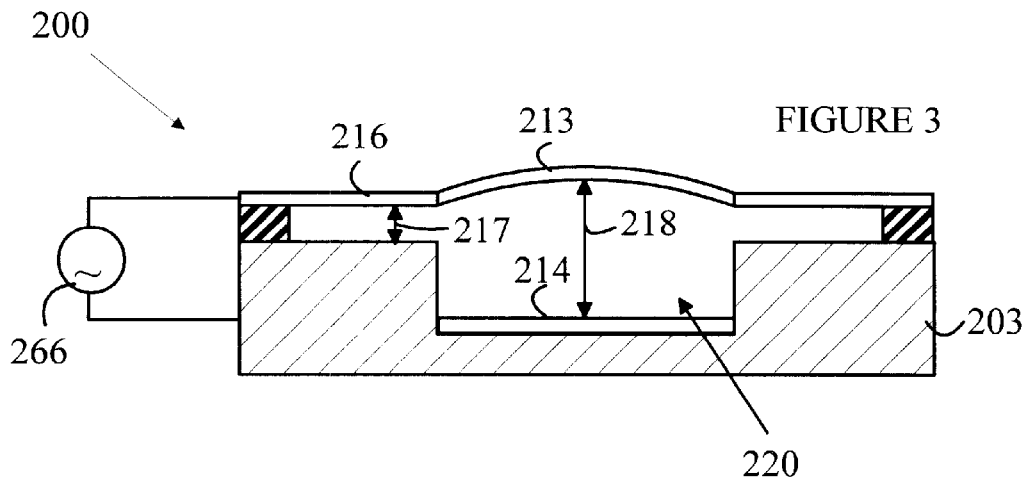
FIG. 3 is a cross-sectional view of a Fabry-Perot filter 200 according to another embodiment of the present invention.

Refer now to FIG. 3, which is a cross-sectional view of a Fabry-Perot filter 200 according to one embodiment of the present invention. In this embodiment of the present invention, the mirror is supported on a circular support membrane 216 instead of discrete cantilevered arms. Filter 200 utilizes a design in which the maximum distance 218 between the mirrors is set independently of the distance 217 between substrate 203 and the support membrane 216. The fixed mirror 214 is located in a well 220 that is etched in substrate 203. Hence, filter 200 provides a relatively large separation between the mirrors while providing a relatively small separation between membrane 216 and substrate 203. The minimum membrane-substrate distance is now set by the range of frequency values over which the resonance frequency of filter 200 is to be adjustable. This distance can be as small as one optical wavelength. In contrast, the distance between the mirrors is typically approximately 5 wavelengths or more.

In addition to providing greater deflections as a function of drive voltage, the arrangement shown in FIG. 3 also provides a means for monitoring the position of the moveable mirror. The reduced spacing between support membrane 216 and substrate 203 results in a substantial increase in the electrical capacitance of the capacitor formed by the support membrane and the underlying substrate. For a support membrane having a diameter of 200–600 microns, the capacitance is of the order of 1pF for a membrane-substrate distance of 0.3–2.5 microns. This level of capacitance can be measured electrically to determine the actual deflection of the support membrane. The resultant instantaneous measurements can be utilized to adjust the deflection voltage so as to dampen the thermal vibrations, and hence, further reduce the noise associated with the thermal vibrations.

Figure 4:
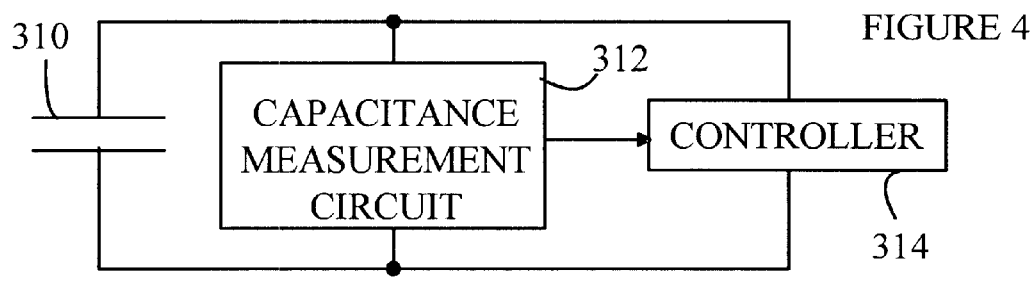
FIG. 4 is a block diagram of a feedback system that can be utilized with a Fabry-Perot filter according to the present invention to servo the deflection voltage.

Refer now to FIG. 4 which is a block diagram of a feedback system that can be utilized with a Fabry-Perot filter according to the present invention to servo the deflection voltage. From the point of view of the feedback circuit, the Fabry-Perot filter is equivalent to a capacitor 310 whose capacitance can be altered by adjusting the voltage across the capacitor. A capacitance measurement circuit 312 measures the instantaneous capacitance. Controller 314 then adjusts the voltage across the Fabry-Perot filter to adjust for any thermal noise fluctuations. The time constant of measurement circuit 312 must be much smaller than the period of the highest frequency noise that is to be canceled. The frequency of the AC signal applied to the capacitor 310 by the capacitance measurement circuit 312 must be at least an order of magnitude higher than the mechanical resonance frequency of the support structure, in order to avoid modulation of the resonance frequency by the applied AC signal.

Figure 5:
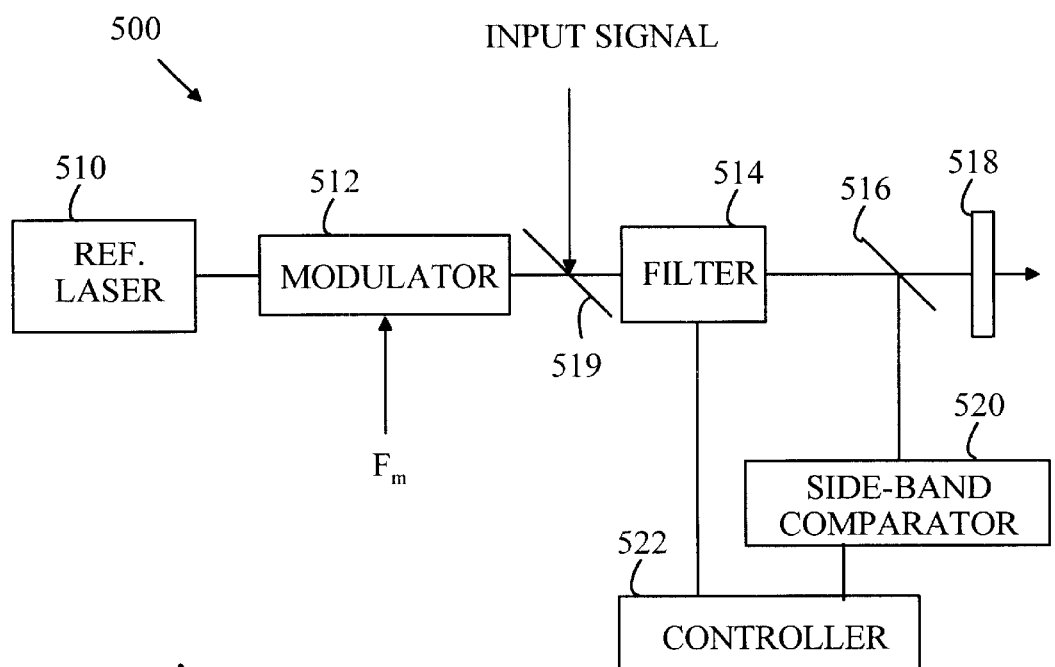
FIG. 5 is a block diagram of a laser stabilized filter arrangement 500 according to one embodiment of the present invention.
Figure 6:
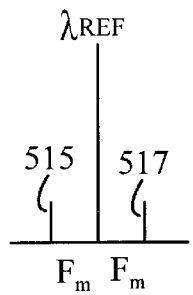
FIG. 6 illustrates the spectral lines used in the feedback arrangement shown in FIG. 7.

A feedback circuit based on a reference laser may also be utilized with a Fabry-Perot filter according to the present invention to reduce the noise. Refer now to FIG. 5, which is a block diagram of a laser stabilized filter arrangement 500 according to one embodiment of the present invention. For the purposes of this discussion, it will be assumed that a reference laser having an output wavelength $\lambda_{ref}$ is used to maintain the filter at a resonance wavelength of $\lambda_f$ where $n\lambda_{ref}=m\lambda_f$. Here, n and m are integers. The Fabry-Perot filter 514 has as its input a combination of the reference signal and the input signal that is to be filtered. The two filters are mixed with the aid of a partially reflecting mirror 519. The reference signal is generated by modulating the reference laser light at a frequency $F_m$ to generate a reference signal having two side bands 515 and 517 spaced about $\lambda_{ref}$ by $F_m$ as shown in FIG. 6. If the resonance frequency of the Fabry-Perot filter is shifted slightly, the side bands will be attenuated differently. A side-band comparison circuit 520 operates on a portion of the light leaving filter 514. The output of circuit 520 is utilized by controller 522 to adjust the control voltage applied between the fixed and moveable mirrors. The reference signal can be blocked from the output light by a filter 518. The modulation frequency can be any frequency that is much larger than the highest frequency noise that is to be eliminated by the feedback arrangement.

It should be noted that a reference laser controller can effectively perform the same modulation operation by modulating the control voltage between the membrane and substrate at $F_m$ instead of modulating the reference laser output. In this case, however, the output from light will have a side band at $F_m$. For many applications, such a side band is of little consequence or the side band can be eliminated by including a notch filter at $F_m$ in the circuitry that detects the light that has been filtered by the filter.

Figure 7:
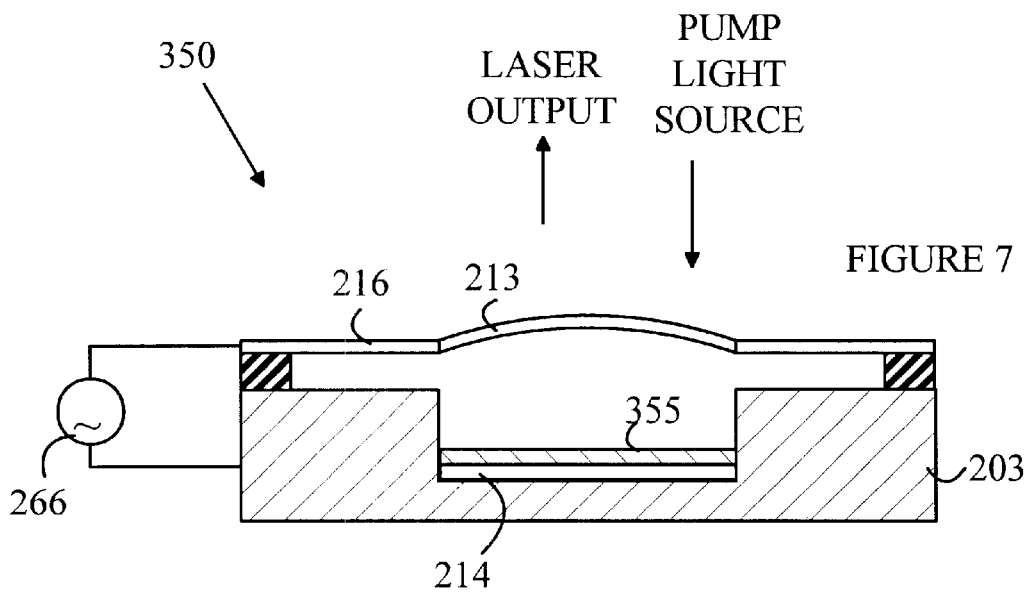
FIG. 7 is a cross-sectional view of a laser 350 constructed from the Fabry-Perot filter shown in FIG. 6.

A Fabry-Perot filter according to the present invention can be converted to a tunable laser by including a material that provides optical gain in the filter cavity. Refer now to FIG. 7, which is, a cross-sectional view of a laser 350 constructed from the Fabry-Perot filter shown in FIG. 6. To simplify the following discussion, those elements of laser 350 that serve the same function as the elements shown in FIG. 5 have been given the same numeric designations in both figures. Laser 350 can use either an optically pumped or an electrically-pumped active region 355 consisting of a multiple quantum well system to amplify the light that bounces back and forth in the optical cavity. The output wavelength of laser 350 is adjusted by applying a voltage between moveable mirror 213 and the substrate 203 to alter the distance between mirrors 213 and 214.

Figure 8:
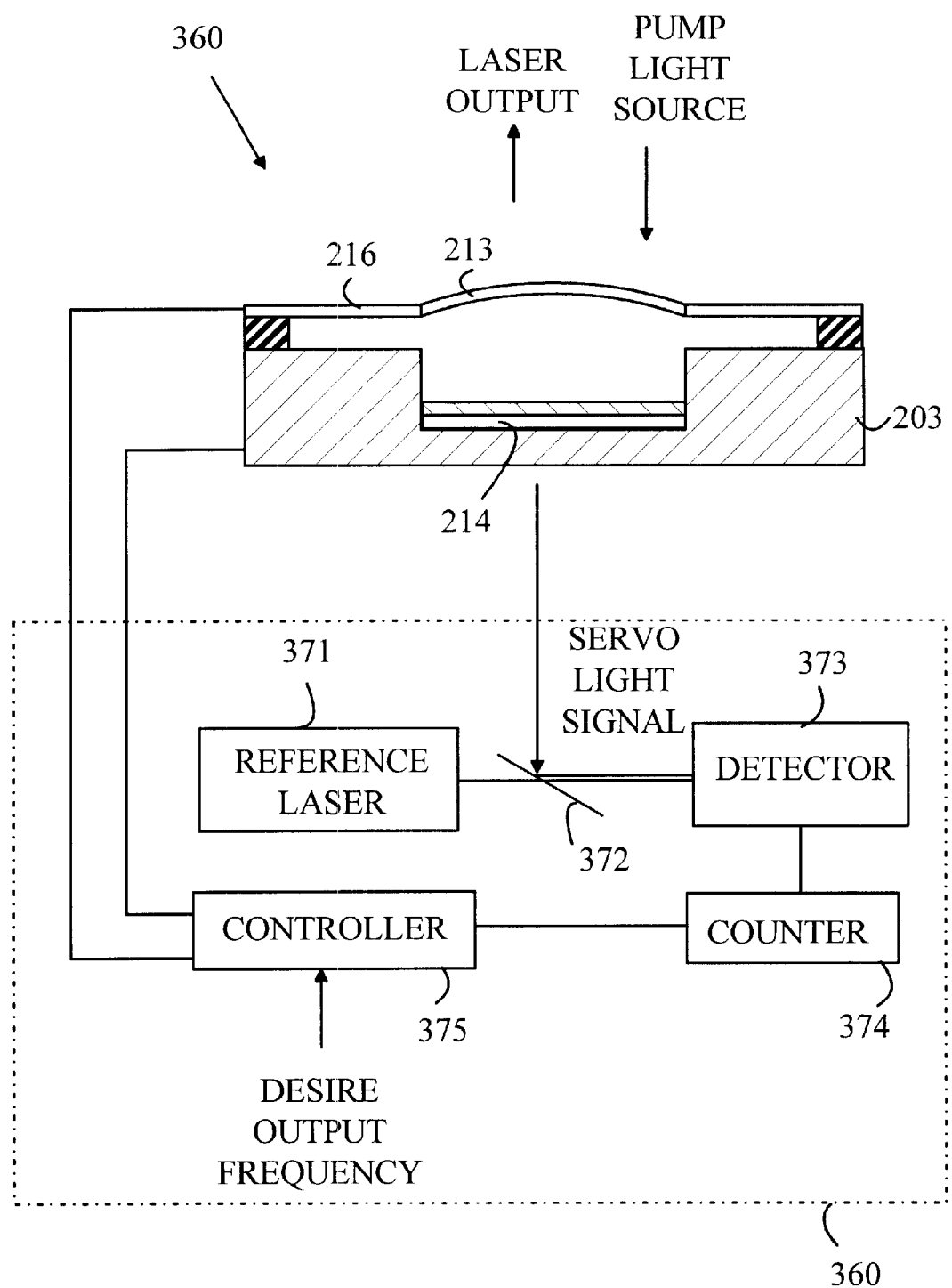
FIG. 8 is a block diagram of a laser feedback circuit 360 controlling the tuning voltage on a tunable laser according to the present invention.

As noted above, a Fabry-Perot filter according to the present invention can be converted to laser by including an active layer in the cavity to amplify the light. The active layer can be optically or electrically pumped. In the case of a laser, the deflection voltage between the support membrane and the substrate can be adjusted by comparing the output of the laser to that of a reference laser. Refer now to FIG. 8, which is a block diagram of a laser feedback circuit 360 controlling the tuning voltage on a tunable laser according to the present invention, such as laser 350 shown in FIG. 7. For the purposes of this discussion, it will be assumed that substrate 203 is transparent, and hence, the servo light signal can be taken through the substrate so as not to disturb the laser output light that leaves via mirror 213. The reflectivity of mirror 214 can be reduced slightly to increase the intensity of the servo light signal if needed. The comparison can be preformed by any method that allows the controller 375 to determine the difference in wavelength between the reference laser and Fabry-Perot laser. For example, the light beams generated by the reference laser 371 and laser 350 can be mixed using a partially reflecting mirror 372 and a detector 373 to generate a signal whose beat frequency is counted by a counter 374. Controller 375 then adjusts the potential between membrane 216 and substrate 203. The reference laser frequency must be chosen such that the beat frequency can be measured in a time that is short compared to the thermal fluctuations that are to be eliminated by the servo mechanism. It will be obvious to those skilled in the art from the preceding discussion that other forms of detectors may also be utilized to make the comparison.

Various modifications to the present invention will become apparent to those skilled in the art from the foregoing description and accompanying drawings. Accordingly, the present invention is to be limited solely by the scope of the following claims.

What is claimed is:

1. A tunable optical cavity having a resonant wavelength selectable in a range about a predetermined wavelength, said cavity comprising:
    a fixed mirror attached to a substrate having a first electrically conducting surface;
    a support member having a moveable mirror supported thereon, said support member having a second electrically conducting surface, said support member being suspended above said substrate;
    a drive circuit for applying an electrical potential between said first and second electrically conducting surfaces; and
    a measurement circuit for measuring the distance between said fixed and moveable mirrors and for adjusting said applied potential in response to said measurement.

2. The optical cavity of claim 1 wherein said measurement circuit comprises a circuit for measuring the capacitative coupling between said support member and said substrate.

3. The optical cavity of claim 1 wherein said measurement circuit comprises a light source having a known spectrum and a circuit for detecting alterations in said spectrum when light from said light source passes through said optical cavity.

4. The optical cavity of claim 1 further comprising an active layer for amplifying light trapped in said cavity.

5. The optical cavity of claim 4 wherein said measurement circuit comprises a circuit for measuring the wavelength of the amplified light.

6. The optical cavity of claim 5 wherein said measurement circuit further comprises a reference laser for generating a reference light signal having a reference wavelength and a circuit for measuring the difference between the wavelength of said amplified light and said reference wavelength.

7. The optical cavity of claim 1 wherein said measurement circuit comprises a reference laser and a circuit for modulating said potential between said substrate and said support member at a predetermined frequency.

* * * * *